(12) United States Patent
Lee et al.

(10) Patent No.: US 8,007,594 B2
(45) Date of Patent: Aug. 30, 2011

(54) METHOD FOR MANUFACTURING SEMICONDUCTOR DEVICE

(75) Inventors: Young Bang Lee, Gyeonggi-do (KR); Kwang Kee Chae, Gyeonggi-do (KR); Ok Min Moon, Gyeonggi-do (KR)

(73) Assignee: Hynix Semiconductor Inc., Gyeonggi-do (KR)

( * ) Notice: Subject to any disclaimer, the term of this patent is extended or adjusted under 35 U.S.C. 154(b) by 0 days.

(21) Appl. No.: 12/834,121

(22) Filed: Jul. 12, 2010

(65) Prior Publication Data
US 2011/0023907 A1 Feb. 3, 2011

(30) Foreign Application Priority Data
Jul. 30, 2009 (KR) .................. 10-2009-0070175

(51) Int. Cl.
*C23G 1/02* (2006.01)
(52) U.S. Cl. ............. 134/3; 134/2; 134/25.4; 134/26; 134/27; 134/28; 134/29; 134/30; 134/34; 134/35; 134/36; 134/41; 134/42; 134/902; 510/175; 510/375; 216/83; 216/92; 216/100; 216/101; 216/105; 216/106; 216/107; 216/108; 216/109; 438/745; 438/748; 438/906

(58) Field of Classification Search .................. 134/2, 3, 134/25.4, 26, 27, 28, 29, 30, 34, 35, 36, 41, 134/42, 902; 510/175, 375; 216/83, 92, 216/100, 101, 105–109; 438/745, 748, 906
See application file for complete search history.

(56) References Cited

U.S. PATENT DOCUMENTS

| | | | | |
|---|---|---|---|---|
| 5,608,943 | A * | 3/1997 | Konishi et al. | 15/302 |
| 6,546,939 | B1 * | 4/2003 | Small | 134/1.3 |
| 6,764,552 | B1 * | 7/2004 | Joyce et al. | 134/3 |
| 2003/0084918 | A1 * | 5/2003 | Kim | 134/1.2 |
| 2004/0094187 | A1 * | 5/2004 | Lee | 134/33 |
| 2007/0161243 | A1 * | 7/2007 | Mellies | 438/689 |

FOREIGN PATENT DOCUMENTS
KR 100884980 B1 2/2009
* cited by examiner

*Primary Examiner* — Sharidan Carrillo
(74) *Attorney, Agent, or Firm* — Ladas & Parry LLP

(57) ABSTRACT

A method for manufacturing a semiconductor device includes the step of conducting a cleaning process for a wafer formed with copper wiring lines to remove contaminations produced on a back surface of the wafer. The cleaning process is conducted by injecting onto the back surface of the wafer an etchant for removing contaminations and simultaneously injecting onto a front surface of the wafer a reductant containing hydrogen.

3 Claims, 1 Drawing Sheet

METHOD FOR MANUFACTURING SEMICONDUCTOR DEVICE

CROSS-REFERENCE TO RELATED APPLICATIONS

The present application claims priority to Korean patent application number 10-2009-0070175 filed on Jul. 30, 2009, which is incorporated herein by reference in its entirety.

BACKGROUND OF THE INVENTION

The present invention relates to a method for manufacturing a semiconductor device, and more particularly, to a method for manufacturing a semiconductor device, which can protect copper from being oxidated when conducting a cleaning process on a wafer formed with copper wiring lines.

As is generally known in the art, semiconductor manufacturing processes include unit processes such as a photolithographic process, a diffusion process, an etching process, a thin film deposition process, and so on. By repeatedly conducting these processes, a semiconductor device having a desired configuration is manufactured.

After each of the unit processes is conducted, a cleaning process is usually conducted in order to remove contaminations such as particles and residues which are the undesirable side-products during these unit processes.

By conducting the cleaning process, the surfaces of a semiconductor substrate can be kept clean. Therefore, the cleaning process is regarded as an important process that determines the quality of a semiconductor device.

For example, in order to remove the contaminations produced on the back surface of a wafer having a front surface on which copper wiring lines are formed and the back surface, a cleaning process is conducted for the wafer by using an FPM (hydrogen fluoride peroxide mixture) solution which contains HF and $H_2O_2$.

In the cleaning process, the FPM solution contacts not only the back surface of the wafer but can also spread onto the peripheral portion of the front surface of the wafer.

Consequently, as the peripheral portion of the front surface of the wafer, in detail, a $Cu_2O$ layer present on the surface of copper is removed by HF of the FPM solution, a problem is caused in that the surface of the copper is exposed. Due to this fact, as the exposed surface of the copper contacts $H_2O_2$ of the FPM solution and air ($O_2$), the copper is oxidated.

If the copper is oxidated, a failure in which an excessive amount of current that goes beyond an allowable range flows in a standby state, that is, a standby current ($I_{SB}$) failure can occur. Due to this fact, the manufacturing yield of semiconductor devices from the wafer is lowered.

BRIEF SUMMARY OF THE INVENTION

An embodiment of the present invention is directed to a method for manufacturing a semiconductor device, which can protect copper from being oxidated when conducting a cleaning process for a wafer formed with copper wiring lines.

Also, an embodiment of the present invention is directed to a method for manufacturing a semiconductor device, which can minimize the occurrence of standby current defects, thereby increasing the manufacturing yield of the semiconductor devices.

In one embodiment of the present invention, a method for manufacturing a semiconductor device includes the step of conducting a cleaning process for a wafer formed with copper wiring lines to remove contaminations produced on a back surface of the wafer, wherein the cleaning process is conducted by injecting an etchant onto the back surface for removing contaminations from the wafer and simultaneously injecting a reductant containing hydrogen onto a front surface of the wafer.

The etchant for removing contaminations may include a mixed solution containing hydrogen peroxide ($H_2O_2$).

The etchant for removing contaminations may include a mixed solution of hydrogen fluoride (HF) and $H_2O_2$.

The reductant containing hydrogen may include hydroxylamine ($NH_2OH$).

The reductant containing hydrogen may be injected at a temperature of 30° C.~50° C.

After the step of conducting the cleaning process, the method may further include the step of rinsing the wafer using deionized (DI) water.

DESCRIPTION OF SPECIFIC EMBODIMENT

In the present invention, a cleaning process is conducted for a wafer formed with copper wiring lines in such a manner that an HF-based etchant is injected onto the back surface of the wafer and a reductant containing hydrogen is simultaneously injected onto the front surface of the wafer.

In this manner, in the present invention, due to the fact that the reductant containing hydrogen is injected, it is possible to protect against the oxidation of copper which is otherwise likely to occur along the peripheral portion of the front surface of the wafer.

Accordingly, in the present invention, the back surface of the wafer can be stably cleaned while protecting against oxidation of copper which is prone to occurring on the peripheral portion of the front surface of the wafer. Therefore, it is possible to minimize the occurrence of standby current failures that are caused from the oxidation of copper.

As a result, in the present invention, as the occurrence of standby current failures are minimized, the manufacturing yield of a semiconductor device is increased.

Hereafter, a specific embodiment of the present invention will be described in detail with reference to the accompanying drawings.

It is to be understood herein that the drawings are not necessarily to scale and in some instances proportions may have been exaggerated in order to more clearly depict certain features of the invention.

Figure 1A:
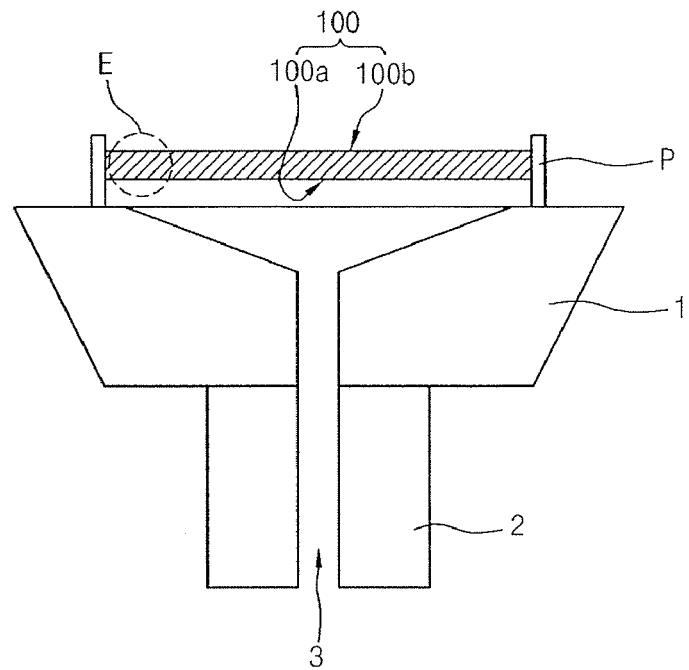
FIGS. 1A and 1B are cross-sectional views illustrating a method for manufacturing a semiconductor device in accordance with an embodiment of the present invention.
Figure 1B:
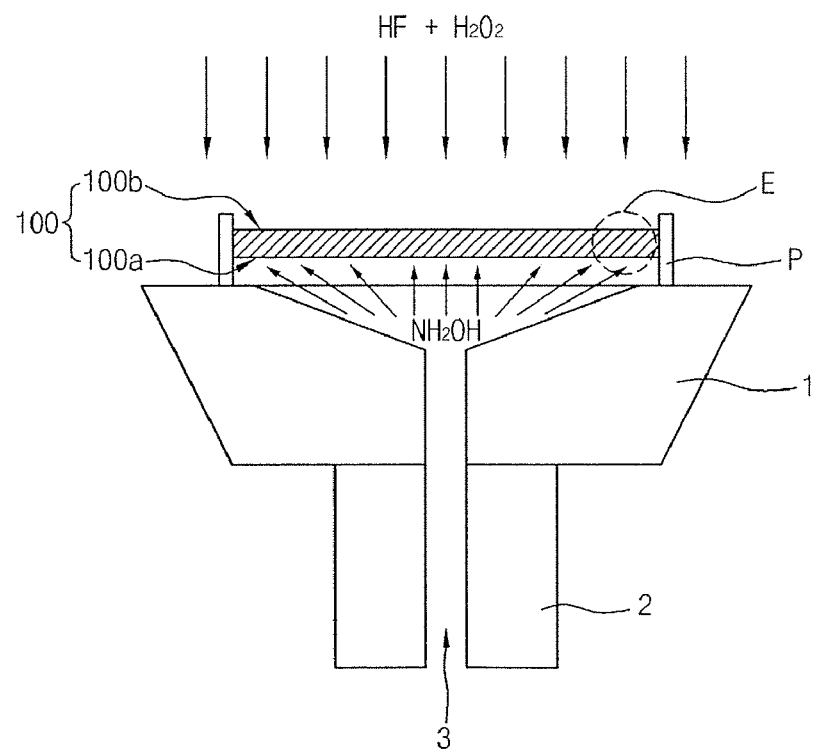

FIGS. 1A and 1B are cross-sectional views illustrating a method for manufacturing a semiconductor device in accordance with an embodiment of the present invention.

Referring to FIG. 1A, a wafer 100, having a front surface 100a on which copper wiring lines (not shown) are formed and a back surface 100b which faces away from the front surface 100a, is loaded in a cleaning apparatus.

The cleaning apparatus includes a wafer chuck 1 over which the wafer 100 is placed, fastening pins P which are provided to the wafer chuck 1 and function to actually fasten the wafer 100, and a rotation shaft 2 which is coupled to the lower end of the wafer chuck 1 and functions to rotate the wafer chuck 1 including the wafer 100 at a predetermined speed.

An injection path 3 is defined through the rotation shaft 2 and the wafer chuck 1. The injection path 3 has nozzles (not shown) for injecting air, gas, powder, liquid, and the like to the front surface 100a of the wafer 100.

Therefore, the wafer 100, which has copper wiring lines on the front surface 100a thereof, can be placed over the wafer chuck 1 by means of the fastening pins P.

Also, as shown in the drawing, the front surface 100a formed with the copper wiring lines of the wafer 100 is disposed to face the wafer chuck 1.

While not shown in a drawing, the back surface 100b of the wafer 100 is formed with a nitride layer (not shown). The nitride layer is formed as an etch stop layer in a process for forming capacitors before forming the copper wiring lines.

Referring to FIG. 1B, in order to remove contaminations (not shown) from the back surface 100b of the wafer 100, a cleaning process is conducted onto the back surface 100b of the wafer 100 that uses an HF-based etchant is injected.

At the same time that the HF-based etchant is injected onto the back surface 100b of the wafer 100, a strong reductant containing hydrogen is simultaneously injected onto the front surface 100a of the wafer 100 through the injection path 3 which is defined through the rotation shaft 2 and the wafer chuck 1.

The HF-based etchant is an etchant for etching an oxide layer and includes, for example, a hydrogen fluoride peroxide mixture (FPM) solution containing HF and $H_2O_2$. The strong reductant containing hydrogen includes, for example, $NH_2OH$.

Since $NH_2OH$ as the strong reductant containing hydrogen functions to dissolve an organic substance, it is injected to prevent the oxidation and corrosion of copper.

Also, because $NH_2OH$ can remove an AMC (airborne molecular contamination) and can stably maintain the wafer 100 in a fresh atmosphere, $NH_2OH$ can prevent or at least protect against oxidation and corrosion of copper.

The strong reductant containing hydrogen is injected onto the front surface 100a of the wafer 100 in order to prevent or at least protect against the oxidation, that is, corrosion of the copper.

In order to improve the reductive reactivity of hydrogen, the strong reductant containing hydrogen is injected at a temperature of, for example, 30° C.~50° C. Further, the strong reductant containing hydrogen can be injected by rotating the rotation shaft 2 at a speed of, for example, 700~1,000 rpm in a counterclockwise direction.

Accordingly, while not illustrated and explained in detail, the strong reductant containing hydrogen can be injected onto the front surface 100a of the wafer 100 through the nozzles communicating with the injection path 3.

Hereafter, a principle for preventing the oxidation of copper by using the HF-based etchant and the strong reductant containing hydrogen will be described.

The following Chemical Equations 1 represents that $NH_2OH$ reacts with $H_2O_2$ of the FPM and air ($O_2$) and prevents the oxidation of copper. The following Chemical Equations 2 represents that $NH_2OH$ removes the contaminations produced on the back surface 100b of the wafer 100, for example, organic compounds having carbon groups.

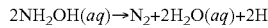

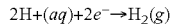

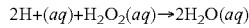

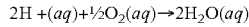 [Chemical Equations 1]

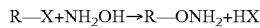

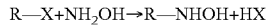 [Chemical Equations 2]

In Chemical Equations 1, it is to be understood that hydrogen (H) of $NH_2OH$ reacts with $O_2$ and $H_2O_2$, which can cause the oxidation of copper, is reduced to $H_2O$, and thereby removes sources capable of oxidating copper. In Chemical Equation 2, it is to be understood that $NH_2OH$ removes the contaminations produced on the back surface 100b of the wafer 100, for example, the organic compounds having carbon groups.

In Chemical Equation 2, R indicates an organic compound having a carbon group, H indicates a hydrogen atom, and X indicates a polymer. An exemplary substance may be R—$CH_2$.

After the cleaning process is conducted on the wafer 100, the wafer 100 is then rinsed using DI (deionized) water.

The reference symbol E designates the peripheral portion of the front surface 100a of the wafer 100.

Thereafter, by sequentially conducting a series of subsequent processes well known in the art, the manufacture of a semiconductor device in accordance with the embodiment of the present invention is completed.

As is apparent from the above description, in the present invention, a cleaning process is conducted for a wafer formed with copper wiring lines in such a manner that an HF-based etchant, for example, a mixed solution of HF and $H_2O_2$ is injected onto the back surface of the wafer and a reductant containing hydrogen, for example, $NH_2OH$ is simultaneously injected onto the front surface of the wafer. As a consequence, it is possible to prevent the oxidation of copper which is otherwise likely to occur on the peripheral portion of the front surface of the wafer.

Accordingly, in the present invention, because the back surface of the wafer can be stably cleaned while protecting against oxidation of copper on the peripheral portion of the front surface of the wafer, then it is possible to minimize the occurrence of a standby current failures that are thought to be caused from the oxidation of copper.

As a result, in the present invention, as the occurrence standby current failures is minimized, the manufacturing yield of the resultant semiconductor devices is increased.

Although a specific embodiment of the present invention has been described for illustrative purposes, those skilled in the art will appreciate that various modifications, additions and substitutions are possible, without departing from the scope and the spirit of the invention as disclosed in the accompanying claims.

What is claimed is:

1. A method for cleaning a wafer, consisting the step of conducting a cleaning process for a wafer having copper wiring lines on a front surface of the wafer, said cleaning process removing contaminations produced on a back surface of the wafer, wherein the cleaning process is conducted by injecting onto the back surface of the wafer an etchant for removing contaminations and simultaneously injecting onto the front surface of the wafer a reductant, wherein the etchant for removing contaminations consists of a mixed solution of HF and H2O2 and the reductant consists of NH2OH; and optionally rinsing the wafer.

2. The method according to claim 1, wherein the reductant is injected at a temperature of 30° C.~50° C.

3. The method according to claim 1, wherein the wafer is rinsed using DI (deionized) water.

* * * * *